United States Patent
Zhao et al.

(10) Patent No.: US 12,147,106 B2
(45) Date of Patent: Nov. 19, 2024

(54) SPLICED SCREEN AND DISPLAY TERMINAL

(71) Applicant: TCL CHINA STAR OPTOELECTRONICS TECHNOLOGY CO., LTD., Guangdong (CN)

(72) Inventors: Jun Zhao, Guangdong (CN); Bin Zhao, Guangdong (CN); Hongyuan Xu, Guangdong (CN); Xing Lei, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/622,849

(22) PCT Filed: Dec. 22, 2021

(86) PCT No.: PCT/CN2021/140492
§ 371 (c)(1),
(2) Date: Dec. 26, 2021

(87) PCT Pub. No.: WO2023/108757
PCT Pub. Date: Jun. 22, 2023

(65) Prior Publication Data
US 2024/0036377 A1 Feb. 1, 2024

(30) Foreign Application Priority Data
Dec. 13, 2021 (CN) .......................... 202111522532.8

(51) Int. Cl.
*G09F 9/00* (2006.01)
*G02F 1/1333* (2006.01)
(Continued)

(52) U.S. Cl.
CPC ........ *G02F 1/13336* (2013.01); *G06F 1/1601* (2013.01); *H01L 25/13* (2013.01); *G09F 9/3026* (2013.01)

(58) Field of Classification Search
CPC ........................... G02F 1/13336; G09F 9/3026
(Continued)

(56) References Cited

U.S. PATENT DOCUMENTS

2013/0176352 A1* 7/2013 Watanabe ............... H05K 7/026
361/807
2015/0362657 A1* 12/2015 Wang ..................... G09G 3/3258
345/82
(Continued)

FOREIGN PATENT DOCUMENTS

CN  104851373 A * 8/2015 ............... G09F 9/33
CN  105825786 A   8/2016
(Continued)

OTHER PUBLICATIONS

Chinese Office Action issued in corresponding Chinese Patent Application No. 202111522532.8 dated Jun. 28, 2022, pp. 1-8.
(Continued)

*Primary Examiner* — Zhengfu J Feng
(74) *Attorney, Agent, or Firm* — PV IP PC; Wei Te Chung

(57) ABSTRACT

A spliced screen and a display terminal are disclosed. In the spliced screen, a structural component is disposed on two adjacent display panels and covers a splicing gap between the two adjacent display panels. A lamp plate is disposed on a surface of the structural component. When the spliced screen displays an image, a plurality of luminescent bodies disposed on the lamp plate close to the display panels also emit light, thereby preventing black strips from appearing on the image. In the spliced screen, a viewing angle of the
(Continued)

display panels and a viewing angle of the lamp plate are same, so that a brightness of the display panels and a brightness of the lamp plates are same when the spliced screen is viewed from a lateral side. As such, display quality is improved.

20 Claims, 4 Drawing Sheets

(51) Int. Cl.
*G06F 1/16* (2006.01)
*H01L 25/13* (2006.01)
*G09F 9/302* (2006.01)

(58) Field of Classification Search
USPC .......................................................... 361/730
See application file for complete search history.

(56) References Cited

U.S. PATENT DOCUMENTS

2018/0267765 A1   9/2018   Wen et al.

2018/0315355 A1*  11/2018   Hu ........................... G09G 3/34
2021/0366378 A1   11/2021   Zhao et al.

FOREIGN PATENT DOCUMENTS

| | | | | |
|---|---|---|---|---|
| CN | 109410773 A | | 3/2019 | |
| CN | 111290154 A | | 6/2020 | |
| CN | 111369900 A | | 7/2020 | |
| CN | 111653207 A | | 9/2020 | |
| CN | 113270049 A | | 8/2021 | |
| CN | 111653207 B | * | 12/2022 | ....... G02F 1/133528 |
| JP | 2012108270 A | * | 6/2012 | ......... G02F 1/13336 |

OTHER PUBLICATIONS

International Search Report in International application No. PCT/CN2021/140492,mailed on Sep. 1, 2022.
Written Opinion of the International Search Authority in International application No. PCT/CN2021/140492,mailed on Sep. 1, 2022.

* cited by examiner

SPLICED SCREEN AND DISPLAY TERMINAL

FIELD

The present disclosure relates to a field of display technologies, and more particularly, to a spliced screen and a display terminal.

BACKGROUND

Spliced screens having display panels and a light-emitting diode (LED) lamp plate can realize a large-scale screen with low cost. In spliced screens having conventional panels and an LED lamp plate, the LED lamp plate covers a splicing gap between two adjacent display panels. Due to technical constraints, a protrusion is formed on a surface of the display panels where the LED lamp plate is disposed when the LED lamp plate covers the splicing gap between the display panels. In addition, the LED lamp plate has a certain height. Therefore, a lateral surface, which cannot emit light, of the LED lamp plate is easy to be viewed when the spliced screens are viewed from a lateral side by users, affecting a display effect of the spliced screens. The users may see black strips appearing on the spliced screens.

SUMMARY

Embodiments of the present disclosure provide a spliced screen and a display terminal to solve an issue of black strips appearing on a display image displayed by conventional screens when the conventional screens are viewed from a lateral side.

An embodiment provides a spliced screen, comprising: at least two display panels spacedly arranged, wherein a splicing gap is defined between the at least two display panels, and each of the at least two display panels comprises a display area and a non-display area defined on a periphery of the display area; at least one structural component disposed on a surface of the at least two display panels corresponding to two sides of the splicing gap, wherein the at least one structural component comprises a bottom surface, a surface, and a façade connecting the bottom surface and the surface, and the bottom surface of the at least one structural component covers the splicing gap; and at least one lamp plate, wherein the at least one lamp plate comprises a wiring plate and a plurality of luminescent bodies disposed on the wiring plate, and the wiring plate is disposed on the at least one structural component along the surface and the façade of the at least one structural component.

An embodiment of the present disclosure further provides a display terminal, comprising the above spliced screen.

Regarding the Beneficial Effects

A structural component is disposed on two adjacent display panels of a spliced screen. A bottom surface of the structural component covers a splicing gap between two adjacent display panels. A lamp plate is disposed on a surface of the structural component. A wiring plate of the lamp plate is disposed on the structural component along the surface of the structural component. Furthermore, a luminescent body is disposed on the wiring plate close to the display panels. Therefore, when the spliced screen displays an image, the luminescent body disposed on the lamp plate close to the display panels also emits light, thereby preventing black strips from appearing on the image. In the spliced screen, a viewing angle of the display panels and a viewing angle of the lamp plate are same. Thus, a brightness of the display panels and a brightness of the lamp plate are same when the spliced screen is viewed from a lateral side, so that display quality is improved.

DESCRIPTION OF DRAWINGS

Technical solutions and beneficial effects of the present disclosure are illustrated below in detail in conjunction with drawings and specific embodiments.

Figure 1:
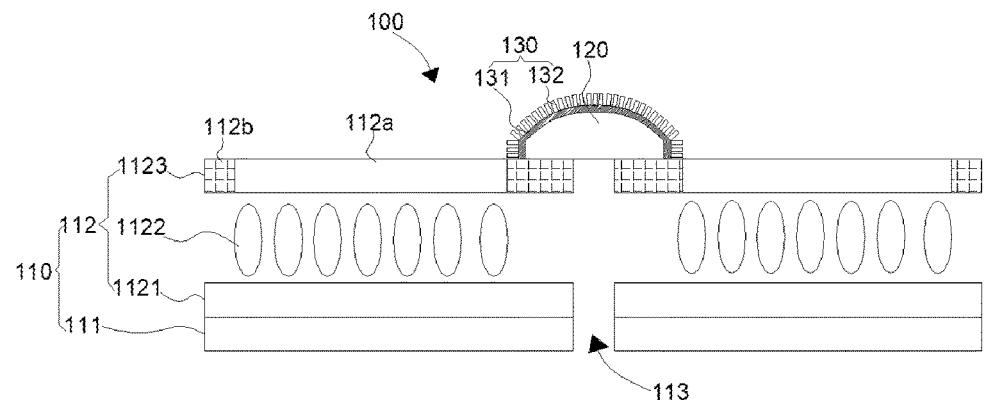
FIG. 1 is a structural schematic view showing a spliced screen according to an exemplary embodiment of the present disclosure.
Figure 2:
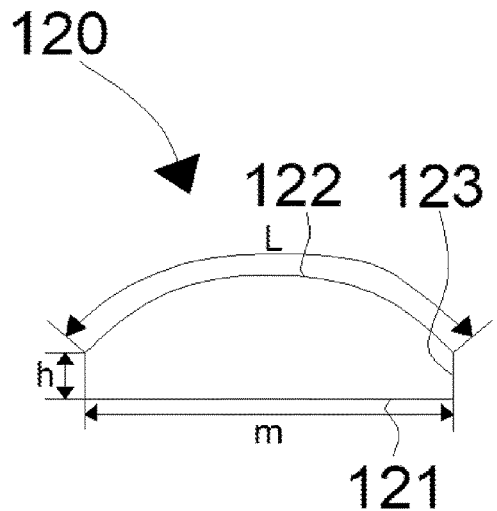
FIG. 2 is a structural schematic view showing a structural component of the spliced screen according to the exemplary embodiment of the present disclosure.
Figure 3:
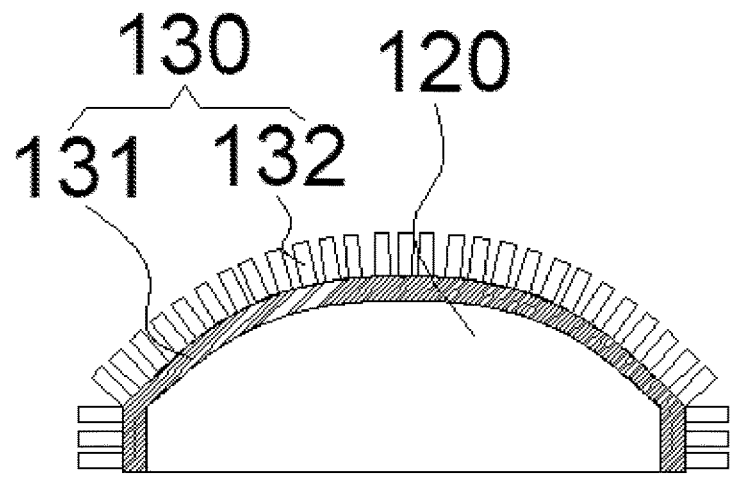
FIG. 3 is a structural schematic view showing the structural component and a lamp plate of the spliced screen according to the exemplary embodiment of the present disclosure.
Figure 4:
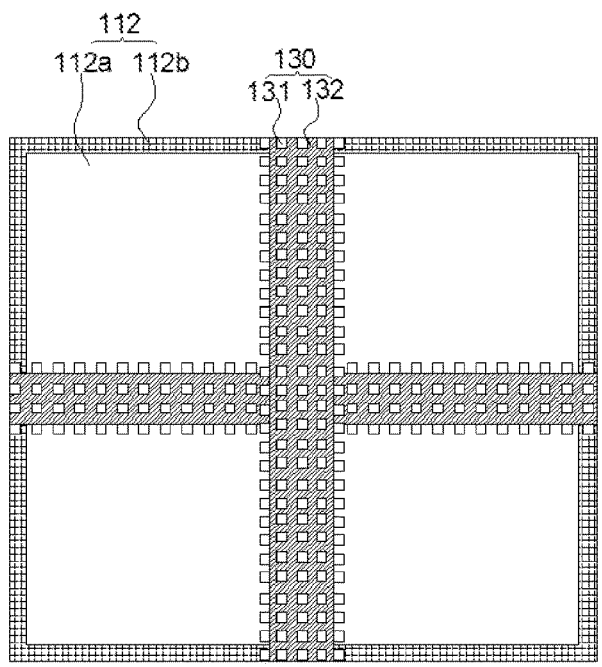
FIG. 4 is a structural schematic top view showing the spliced screen according to the exemplary embodiment of the present disclosure.

Reference numbers in the drawings are as follows:
spliced screen 100, display panel 110, backlight module 111, liquid crystal display panel 112, display area 112a, non-display area 112b, array substrate 1121, liquid crystal layer 1122, color filter substrate 1123, splicing gap 113, structural component 120, 120' 120", 120''', and 120'''', bottom surface 121, surface 122, 122' and 122", façade 123 and 123', plate body 124, lamp plate 130, wiring plate 131, luminescent body 132.

DETAILED DESCRIPTION

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

In the present disclosure, a structural component is disposed on two adjacent display panels of a spliced screen. A bottom surface of the structural component covers a splicing gap between two adjacent display panels. A lamp plate is disposed on a surface of the structural component. A wiring plate of the lamp plate is disposed on the structural component along the surface of the structural component. Furthermore, a luminescent body is disposed on the wiring plate close to the display panels. Therefore, when the spliced screen displays an image, the luminescent body disposed on the lamp plate close to the display panels also emits light, thereby preventing black strips from appearing on the image. In the spliced screen, a viewing angle of the display panels and a viewing angle of the lamp plate are same. Thus, a brightness of the display panels and a brightness of the lamp plate are same when the spliced screen is viewed from a lateral side, so that display quality is improved. Typically, the spliced screen can be used in display terminals such as broadcasting media or big data centers.

In one embodiment of the present disclosure, please refer to FIGS. 1 to 4, a spliced screen 100 includes at least two display panels 110, a structural component 120, and a lamp plate 130. In the present embodiment, the display panels 110 are liquid crystal display (LCD) panels. Also, the display panels 110 may be organic light-emitting diode (OLED) display panels. Each of the display panels 110 includes a backlight module 111 and an LCD panel 112. The LCD panel 112 includes an array substrate 1121, a liquid crystal layer 1122, and a color filter substrate 1123, which are stacked. The LCD panel 112 includes a display area 112*a* and a non-display area 112*b* disposed on a periphery of the display area 112*a*. Two display panels 110 are spacedly arranged. A splicing gap 113 is defined between two display panels 110 spliced to each other. Specifically, the splicing gap 113 is defined between adjacent non-display areas 112*b* of the two display panels 110. A structural component 120 is disposed on the two display panels 110. Specifically, the structural component 120 is disposed on the display panels 110 corresponding to two sides of the splicing gap 113. The structural component 120 includes a bottom surface 121, a surface 122, and a façade 123 connecting the bottom surface 121 and the surface 122. The bottom surface of the structural component 120 covers the splicing gap 113. The lamp plate 130 includes a wiring plate 131 and a plurality of luminescent bodies 132 disposed on the wiring plate 131. The luminescent bodies 132 are formed on the wiring plate 131 by a die bonding process. A surface of the wiring plate 131 can be provided with an encapsulation adhesive to encapsulate the luminescent bodies 132 on the wiring plate 131. In the present embodiment, one of the luminescent bodies 132 is disposed on a junction between the surface 122 of the structural component 120 and the bottom surface 121 of the structural component 120 on the wiring plate 131. The wiring plate 131 of the lamp plate 130 is disposed on the structural component 120 along the surface 122 of the structural component 120 and the façade 123 of the structural component 120. That is, the wiring plate 131 covers the surface 122 of the structural component 120 and the façade 123 of the structural component 120. The wiring plate 131 is a flexible circuit plate. The wiring plate 131 is attached to the surface 122 of the structural component 120 by an adhesive layer 133.

In the present embodiment, the bottom surface 121 of the structural component 120 extends to a junction between the display area 112*a* and the non-display area 112*b* of adjacent display panels 112. That is, the bottom surface 121 covers not only the splicing gap 113 but also the non-display area 112*b* of the adjacent display panels 112 close to the splicing gap 113. The display panels 10 have advantages such as large display area, high stability, and low cost. However, the display panels 10 cannot realize a full-screen display because the display panels 10 have a frame (non-display area 112*b*). Although multiple display panels 110 can be spliced to each other to form a large spliced screen, the splicing gap 113 having a relatively large area is defined between the display panels 110 and cannot be eliminated. By covering the non-display area 112*b* by the bottom surface 121 of the structural component 120, the spliced screen 100 can display an image without the splicing gap. The display panels 110 are arranged in an array manner and are spliced to each other. The bottom surface 121 of the structural component 120 covers the splicing gap 113 between any two adjacent display panels 110.

A control plate (not shown) is disposed on a surface of the backlight module 111 away from the LCD panel 112. The backlight module 111 and the wiring plate 131 are electrically connected to the control plate, respectively. The control plate controls the backlight module 111 to emit light. The control plate controls the luminescent bodies 132 to emit light by the wiring plate 131. The wiring plate 131 can be electrically connected to the control plate by a wire in the splicing gap 113. The luminescent bodies 132 are disposed on both the surface 122 of the structural component 120 and the façade 123 of the structural component 120, and the façade 123 faces the display area 112*a*. Therefore, light emitted from one luminescent body 132 disposed on the façade 123 can cover the façade 123. As such, all light emitted from the light plate 130 can be viewed. As a result, black strips will not appear on an image displayed by the spliced screen 100, so that display quality is improved.

In another embodiment, three luminescent bodies 132 are disposed on the surface 122 of the structural component 120 and the façade 123 of the structural component 120, thereby forming a combination of a red luminescent body, a green luminescent body, and a blue luminescent body. Therefore, light emitted from a position corresponding to the façade 123 can be more evenly, and display quality is improved. An ink layer is formed on the wiring plate 131 between two adjacent luminescent bodies 132 by inkjet printing. The ink layer is configured to reflect light emitted from adjacent luminescent bodies 132, thereby reducing a brightness of the lamp plate 130 when the lamp plate 130 is viewed from a front side, and significantly reducing a brightness of the lamp plate 130 when the lamp plate 130 is viewed from a lateral side.

In another embodiment, the bottom surface 121 can cover part of the non-display area 112*b* of adjacent LCD panels 112 close to the splicing gap 113. The rest of the non-display area 112*b* between the bottom surface 121 and the adjacent display areas 112*a* can be covered by the luminescent bodies 132 disposed on the façade 123 and protruding from the façade 123.

In the present embodiment, the structural component 120 has a solid structure. The surface 122 of the structural component 120 is an arc surface. The surface 122 is connected to the bottom surface 121 by the façade 123. The luminescent bodies 132 are disposed on the façade 123, thereby allowing all light emitted from the lamp plate 130 to be viewed, and preventing dark strips from appearing on an image displayed by the spliced screen 100.

The luminescent bodies 132 are LED lamps such as mini LEDs or micro LEDs. The façade 123 is perpendicular to the bottom surface 121. A height h of the façade 123 is equal to a pitch between two adjacent luminescent bodies 132. A length L of the surface 122 (arc surface) is equal to a length of the wiring plate 131 minus two times the height h. A length m of the bottom surface 121 is equal to a pitch between a junction between the display area 112a and the non-display area 112b of one LCD panel 112 and a junction between the display area 112a and the non-display area 112b of another LCD panel 112.

Figure 5:
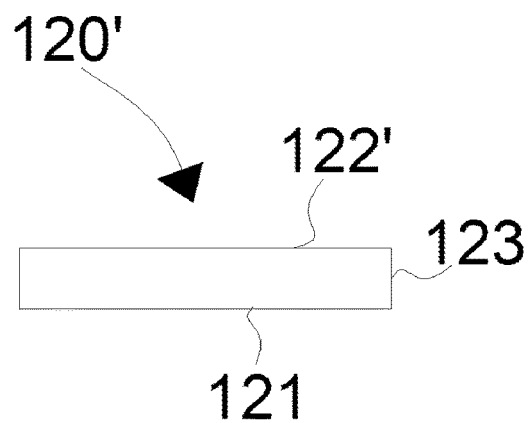
FIG. 5 is a structural schematic view showing a structural component of a spliced screen according to another exemplary embodiment of the present disclosure.
Figure 6:
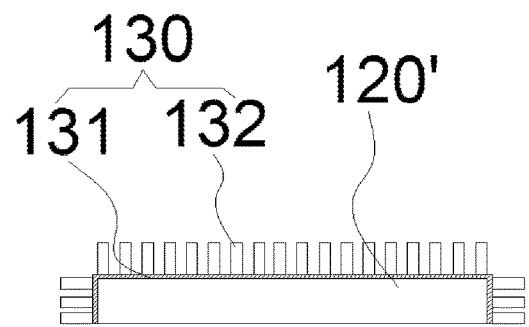
FIG. 6 is a structural schematic view showing the structural component and a lamp plate of the spliced screen according to another exemplary embodiment of the present disclosure.

In another embodiment, please refer to FIG. 5 and FIG. 6, a bottom surface 121 of a structural component 120' is a planar surface and a surface 122' is a planar surface. Since the surface 122' is designed to be a planar surface, a lamp plate 130 and the structural component 120' can be assembled more easily. A junction between the surface 122' and the façade 123 can be designed to be a circular angle (not shown). Therefore, the lamp plate 130 and the structural component 120' can be assembled more smoothly, thereby preventing a lifespan of the lamp plate 130 from being affected by edges and corners of the junction between the surface 122' and the façade 123.

Figure 7:
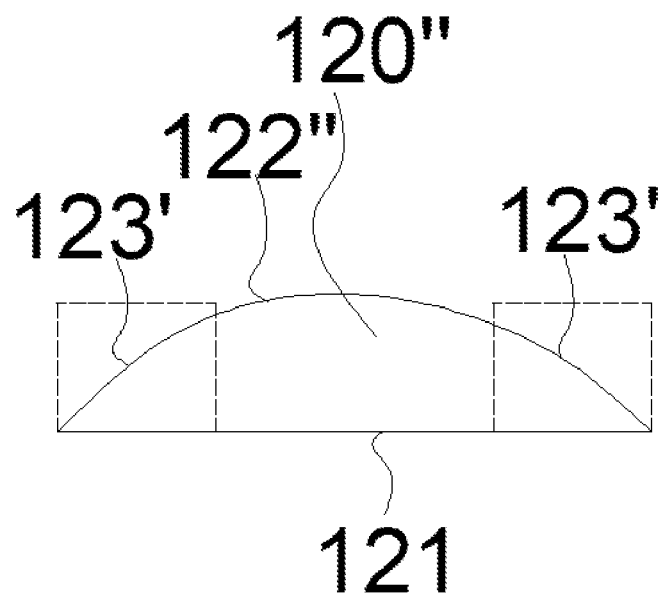
FIG. 7 is a structural schematic view showing a structural component of a spliced screen according to yet another exemplary embodiment of the present disclosure.
Figure 8:
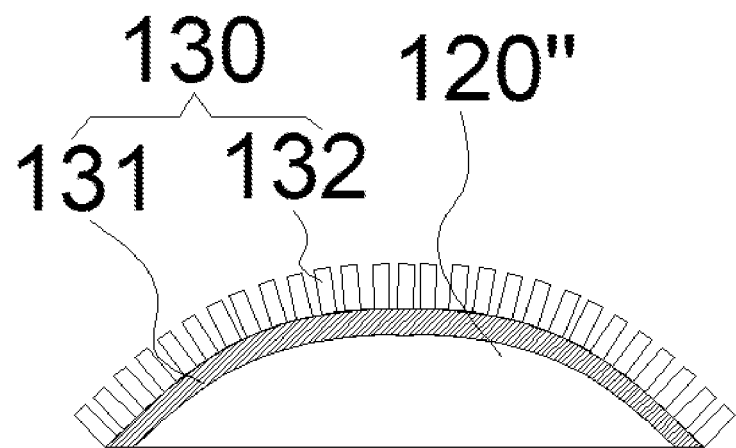
FIG. 8 is a structural schematic view showing the structural component and a lamp plate of the spliced screen according to yet another exemplary embodiment of the present disclosure.

In another embodiment of the present disclosure, as shown in FIG. 7 and FIG. 8, a bottom surface 121 of a structural component 120" is a planar surface, a façade 123' is an arc surface, and a surface 122" is an arc surface. A radian of the façade 123' is equal to a radian of the surface 122", thereby forming a structure having a uniform radian. Therefore, a lamp plate 130 and the structural component 122" can be assembled more easily. Alternatively, the radian of the façade 123' and the radian of the surface 122' can be different to satisfy requirements of different structures.

Figure 9:
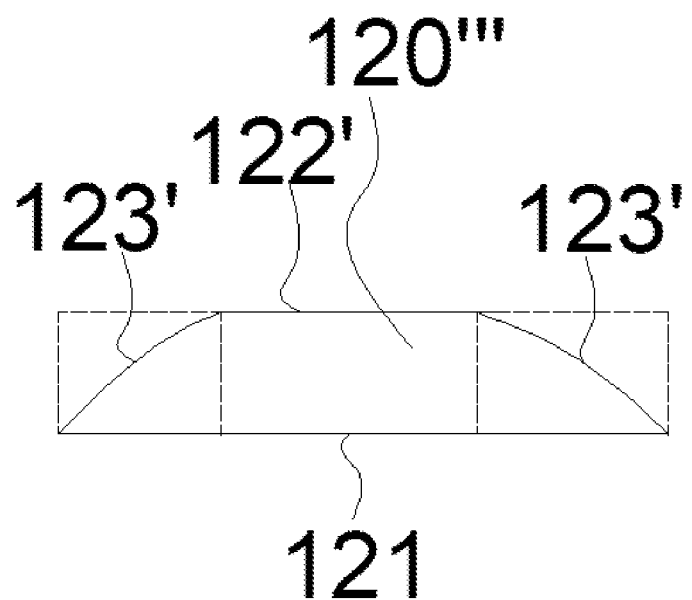
FIG. 9 is a structural schematic view showing a structural component of a spliced screen according to still another exemplary embodiment of the present disclosure.

In another embodiment of the present disclosure, as shown in FIG. 9, a bottom surface 121 of a structural component 120''' is a planar surface, a façade 123' is an arc surface, and a surface 122' is a planar surface. Since the façade 123' is designed to be an arc surface, a certain angle is formed between light emitted from the luminescent bodies 132 disposed on the façade 123' and a horizontal surface (a plane where the display area 112a of the display panels 110 is defined). Therefore, black strips viewed from a lateral side can be eliminated.

Figure 10:
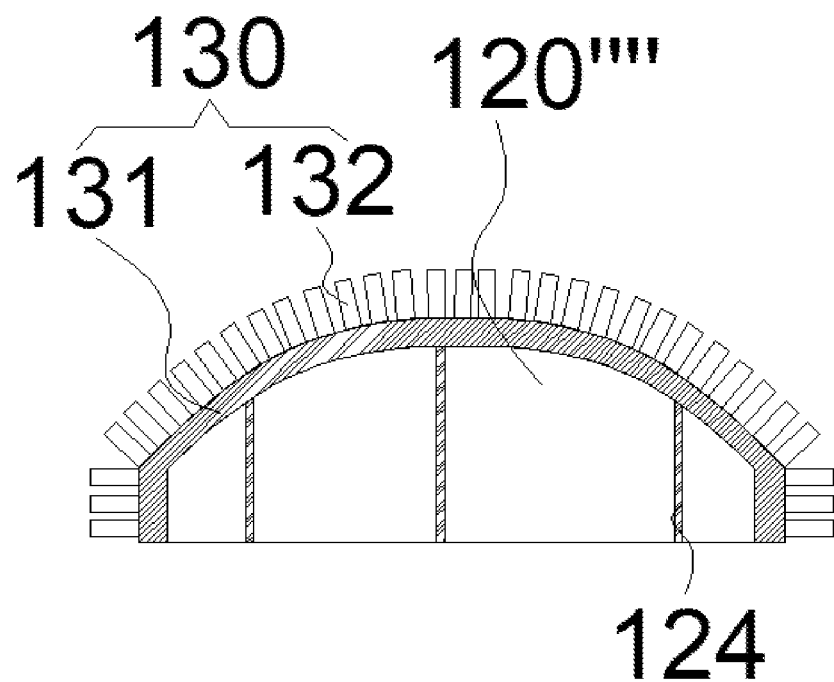
FIG. 10 is a structural schematic view showing a structural component of a spliced screen according to still another exemplary embodiment of the present disclosure.

In another embodiment, as shown in FIG. 10, a structural component 120"" has a hollow structure. At least one plate body 124 is disposed in the structural component 120"". An interior of the structural component 120"" is separated into two compartments arranged side by side by the plate body 124. Since the structural component 120"" has a hollow structure, a material for manufacturing the structural component 120"" can be reduced without reducing support strength of the structural component 120"" to a lamp plate 130. Therefore, cost is reduced.

In summary, the present disclosure has been described with preferred embodiments thereof. The preferred embodiments are not intended to limit the present disclosure, and it is understood that many changes and modifications to the described embodiments can be carried out without departing from the scope and the spirit of the disclosure that is intended to be limited only by the appended claims.

What is claimed is:

1. A spliced screen, comprising:
    at least two display panels spacedly arranged, wherein a splicing gap is defined between the at least two display panels, and each of the at least two display panels comprises a display area and a non-display area defined on a periphery of the display area;
    at least one structural component disposed on a first surface of the at least two display panels corresponding to two sides of the splicing gap, wherein the at least one structural component comprises a bottom surface, a top surface, and a façade connecting the bottom surface and the top surface, and the bottom surface of the at least one structural component covers the splicing gap; and
    at least one lamp plate, wherein the at least one lamp plate comprises a wiring plate and a plurality of luminescent bodies disposed on the wiring plate, and the wiring plate is disposed on the at least one structural component along the top surface and the façade of the at least one structural component; wherein the plurality of luminescent bodies is spaced from each other along the wiring plate, and a portion of the wiring plate between adjacent luminescent bodies of the plurality of luminescent bodies is covered by ink.

2. The spliced screen of claim 1, wherein the splicing gap is defined between adjacent non-display areas of the at least two display panels, and the at least one structural component covers at least part of the adjacent non-display areas of the at least two display panels.

3. The spliced screen of claim 2, wherein the bottom surface of the at least one structural component is a planar surface, and the façade of the at least one structural component is an arc surface.

4. The spliced screen of claim 2, wherein the top surface of the at least one structural component is an arc surface, and the façade of the at least one structural component is a planar surface.

5. The spliced screen of claim 2, wherein the bottom surface of the at least one structural component is a planar surface, the façade of the at least one structural component is an arc surface, and the top surface of the at least one structural component is a second planar surface.

6. The spliced screen of claim 3, wherein an adhesive layer is disposed on a second surface of the at least one structural component corresponding to the wiring plate.

7. The spliced screen of claim 4, wherein the façade is perpendicular to the bottom surface, and a length of the façade is at least equal to a distance between the adjacent luminescent bodies of the plurality of luminescent bodies.

8. The spliced screen of claim 2, wherein two ends of the bottom surface of the at least one structural component respectively extends to a junction between the display area and the non-display area of the at least two display panels adjacent to each other.

9. The spliced screen of claim 8, wherein the at least one structural component comprises a plate body, the plate body is disposed in the at least one structural component to separate an interior of the at least one structural component into at least two compartments arranged side by side.

10. The spliced screen of claim 8, wherein the wiring plate is a flexible wiring plate.

11. A display terminal, comprising a spliced screen, wherein the spliced screen comprises:
    at least two display panels spacedly arranged, wherein a splicing gap is defined between the at least two display panels, and each of the at least two display panels comprises a display area and a non-display area defined on a periphery of the display area;
    at least one structural component disposed on a first surface of the at least two display panels corresponding to two sides of the splicing gap, wherein the at least one structural component comprises a bottom surface, a top surface, and a façade connecting the bottom surface and the top surface, and the bottom surface of the at least one structural component covers the splicing gap; and at least one lamp plate, wherein the at least one lamp plate comprises a wiring plate and a plurality of luminescent bodies disposed on the wiring plate, and the wiring plate is disposed on the at least one structural component along the top surface and the façade of the at least one structural component; wherein the plurality of luminescent bodies is spaced from each other along the wiring plate, and a portion of the wiring plate between adjacent luminescent bodies of the plurality of luminescent bodies is covered by ink.

12. The display terminal of claim 11, wherein the splicing gap is defined between adjacent non-display areas of the at least two display panels, and the at least one structural component covers at least part of the adjacent non-display areas of the at least two display panels.

13. The display terminal of claim 12, wherein the bottom surface of the at least one structural component is a planar surface, and the façade of the at least one structural component is an arc surface.

14. The display terminal of claim 12, wherein the top surface of the at least one structural component is an arc surface, and the façade of the at least one structural component is a planar surface.

15. The display terminal of claim 12, wherein the bottom surface of the at least one structural component is a planar surface, the façade of the at least one structural component is an arc surface, and the top surface of the at least one structural component is a second planar surface.

16. The display terminal of claim 13, wherein an adhesive layer is disposed on a second surface of the at least one structural component corresponding to the wiring plate.

17. The display terminal of claim 14, wherein the façade is perpendicular to the bottom surface, and a length of the façade is at least equal to a distance between the adjacent luminescent bodies of the plurality of luminescent bodies.

18. The display terminal of claim 12, wherein two ends of the bottom surface of the at least one structural component respectively extends to a junction between the display area and the non-display area of the at least two display panels adjacent to each other.

19. The display terminal of claim 18, wherein the at least one structural component comprises a plate body, the plate body is disposed in the at least one structural component to separate an interior of the at least one structural component into at least two compartments arranged side by side.

20. The display terminal of claim 18, wherein the wiring plate is a flexible wiring plate.

* * * * *